US012567841B2

(12) United States Patent
Serttek et al.

(10) Patent No.: US 12,567,841 B2
(45) Date of Patent: Mar. 3, 2026

(54) RADIO FREQUENCY SIGNAL LIMITERS WITH DIODE-ENHANCED LIMITING

(71) Applicant: Analog Devices International Unlimited Company, Limerick (IE)

(72) Inventors: Ozgun Serttek, Istanbul (TR); Turusan Kolcuoglu, Sariyer (TR)

(73) Assignee: Analog Devices International Unlimited Company, Limerick (IE)

( * ) Notice: Subject to any disclaimer, the term of this patent is extended or adjusted under 35 U.S.C. 154(b) by 445 days.

(21) Appl. No.: 18/328,275

(22) Filed: Jun. 2, 2023

(65) Prior Publication Data

US 2024/0405729 A1      Dec. 5, 2024

(51) Int. Cl.
| | |
|---|---|
| *H03F 1/22* | (2006.01) |
| *H03F 1/52* | (2006.01) |
| *H03F 3/19* | (2006.01) |

(52) U.S. Cl.
CPC ................. *H03F 1/52* (2013.01); *H03F 3/19* (2013.01); *H03F 2200/294* (2013.01); *H03F 2200/426* (2013.01); *H03F 2200/451* (2013.01)

(58) Field of Classification Search
CPC .......................................... H03F 1/22
USPC ................................... 330/311, 310
See application file for complete search history.

(56) References Cited

U.S. PATENT DOCUMENTS

| | | | | |
|---|---|---|---|---|
| 7,911,280 | B2 * | 3/2011 | Koerner | H03F 1/22 |
| | | | | 330/311 |
| 8,111,104 | B2 * | 2/2012 | Ahadian | H03F 1/223 |
| | | | | 330/311 |
| 8,779,860 | B2 * | 7/2014 | Jeon | H03F 1/223 |
| | | | | 330/311 |
| 8,928,388 | B2 | 1/2015 | Lu et al. | |
| 10,447,032 | B2 * | 10/2019 | Lu | H02H 9/008 |
| 2015/0002238 | A1 | 1/2015 | Ryu et al. | |
| 2019/0260414 | A1 | 8/2019 | Benson | |
| 2021/0399757 | A1 | 12/2021 | Prathamesh et al. | |

* cited by examiner

*Primary Examiner* — Henry Choe
(74) *Attorney, Agent, or Firm* — Knobbe, Martens, Olson & Bear, LLP

(57) ABSTRACT

Apparatus and methods for RF signal limiters with diode-enhanced limiting are provided. In certain embodiments, an RF signal limiter includes a field-effect transistor (FET) stack electrically connected between an RF signal path and a limiting node, such as ground. The FET stack includes a first or topmost FET having a drain connected to the RF signal path. The gate of the topmost FET is biased through a first gate resistor. The RF signal limiter further includes a first forward enhancement diode having an anode connected to the RF signal path and a cathode connected to the gate of topmost FET.

20 Claims, 8 Drawing Sheets

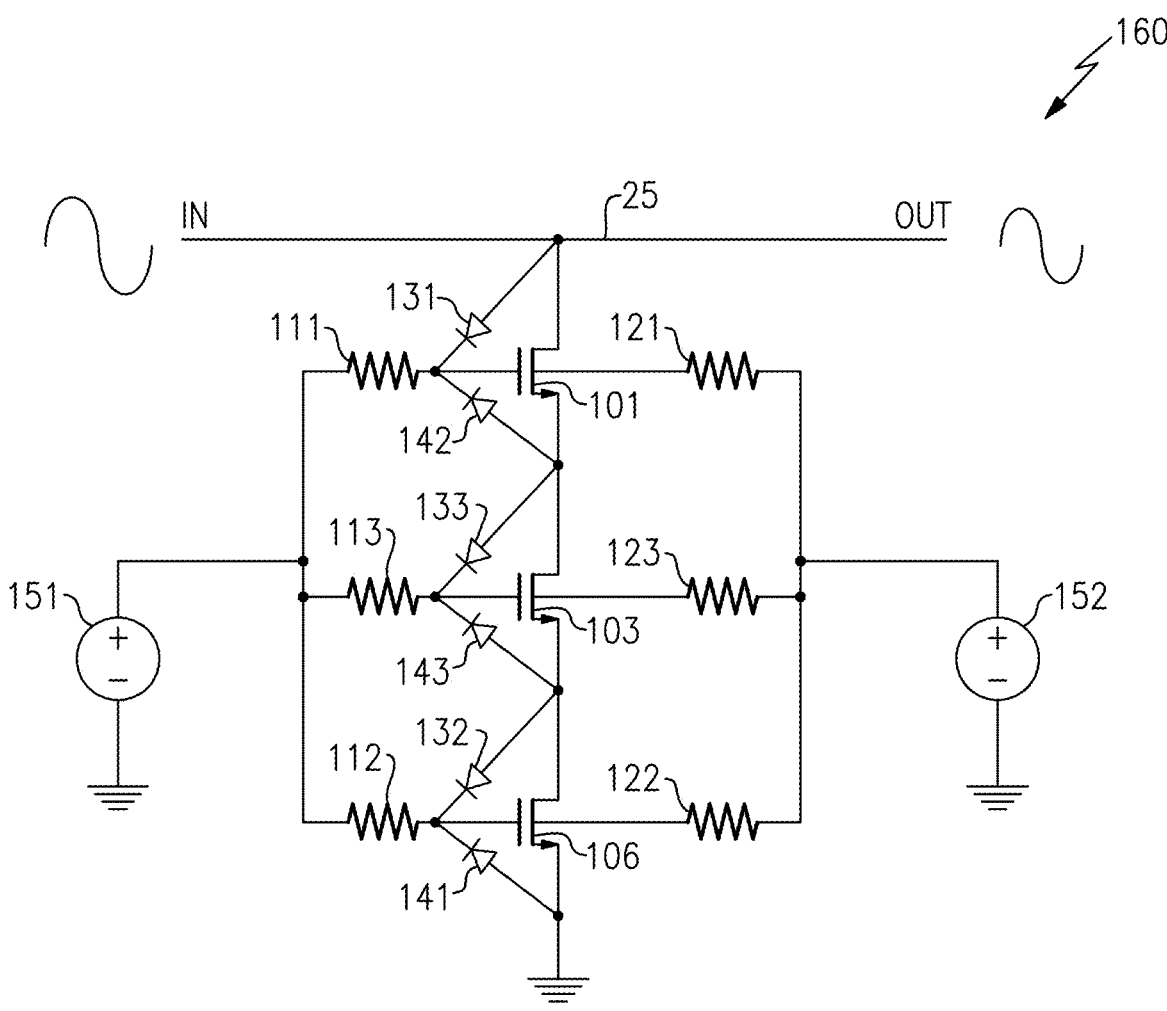
<u>FIG.3</u>

RADIO FREQUENCY SIGNAL LIMITERS WITH DIODE-ENHANCED LIMITING

FIELD OF THE DISCLOSURE

Embodiments of the invention relate to electronics, and more particularly, to radio frequency (RF) signal limiters.

BACKGROUND

An RF communication system can include one or more RF signal limiters for limiting RF signals. For example, an RF signal limiter can be included to protect an input to a low noise amplifier (LNA) of an RF communication system. Since an LNA can serve as a first active component in a receiver, absent protection the LNA can be exposed to high power RF signals that could otherwise damage the LNA and/or interfere with the operation of the LNA.

Examples of RF communication systems with one or more limiters include, but are not limited to, base stations, mobile devices (for instance, smartphones or handsets), laptop computers, tablets, and wearable electronics.

SUMMARY OF THE DISCLOSURE

Apparatus and methods for RF signal limiters with diode-enhanced limiting are provided. In certain embodiments, an RF signal limiter includes a field-effect transistor (FET) stack electrically connected between an RF signal path and a limiting node, such as ground. The FET stack includes a first or topmost FET having a drain connected to the RF signal path. The gate of the topmost FET is biased through a first gate resistor. The RF signal limiter further includes a first forward enhancement diode having an anode connected to the RF signal path and a cathode connected to the gate of topmost FET. In certain implementations, the FET stack further includes a second or bottommost FET having a source connected to the limiting node and a gate biased through a second gate resistor, and the RF signal limiter further includes a first reverse enhancement diode having an anode connected to the limiting node and a cathode connected to the gate of the bottommost FET.

By including the first forward enhancement diode, the gate of the topmost FET is charged to modulate the gate voltage in response to a large forward RF signal that raises the voltage of the RF signal path over the voltage of the limiting node. This in turn lowers the on-state resistance of the FET stack and leads to improved power handling and/or leakage power compared to a limiter with similarly sized FETs but without diodes. Likewise, by including the first reverse enhancement diode, the gate of bottommost FET is charged to modulate the gate voltage in response to a large reverse RF signal that lowers the voltage of the RF signal path below the voltage of the limiting node. The RF signal limiter can include additional FETs, forward enhancement didoes, and/or reverse enhancement diodes to enhance performance. Such enhancement diodes can be connected in a variety of configurations as disclosed herein.

In one aspect, an RF signal limiter includes an RF signal path configured to receive an RF signal and a FET stack electrically connected between the RF signal path and a limiting node. The FET stack includes a first FET having a drain connected to the RF signal path. The RF signal limiter further includes a first gate resistor connected between a control terminal and a gate of the first FET, and a first forward enhancement diode having an anode connected to the RF signal path and a cathode connected to the gate of the first FET.

In another aspect, an RF communication system includes an RF amplifier configured to amplify an RF signal received from an RF signal path, and an RF signal limiter that includes a FET stack electrically connected between the RF signal path and a limiting node. The FET stack includes a first FET having a drain connected to the RF signal path. The RF signal limiter further includes a first gate resistor connected between a control terminal and a gate of the first FET, and a first forward enhancement diode having an anode connected to the RF signal path and a cathode connected to the gate of the first FET.

In another aspect, a method of RF signal limiting is disclosed. The method includes receiving an RF signal on an RF signal path and limiting the RF signal using a FET stack electrically connected between the RF signal path and a limiting node. The FET stack includes a first FET having a drain connected to the RF signal path. The method further includes biasing the FET stack using a control terminal that is connected to a gate of the first FET through a first gate resistor, modulating a voltage of the gate of the first FET using a first forward enhancement diode having an anode connected to the RF signal path and a cathode connected to the gate of the first FET.

BRIEF DESCRIPTION OF THE DRAWINGS

FIG. 3 is a schematic diagram of an RF signal limiter according to another embodiment.

DETAILED DESCRIPTION OF EMBODIMENTS

Figure 1A:
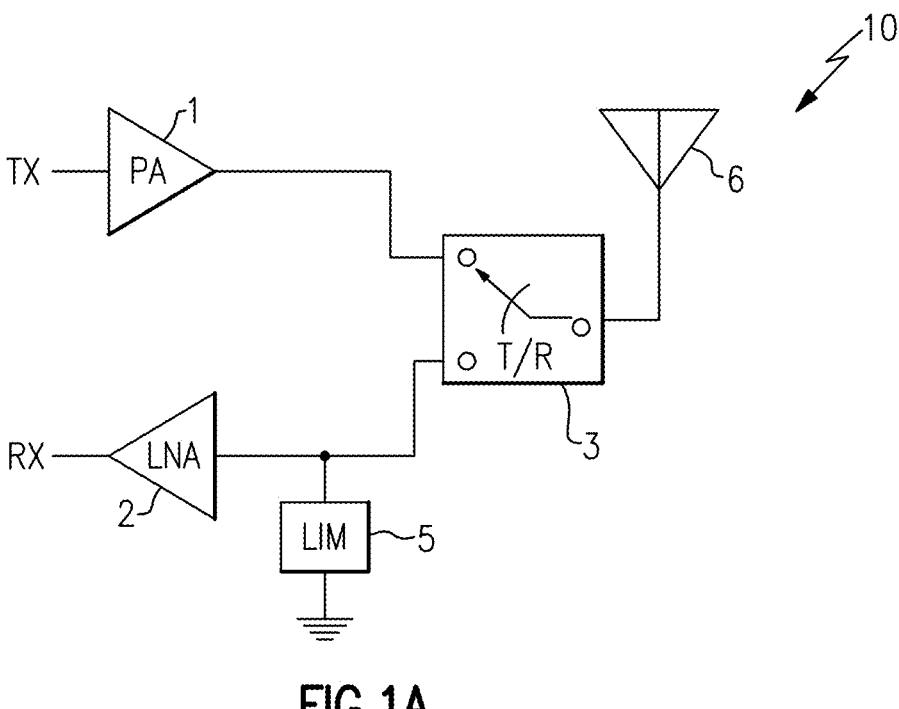
FIG. 1A is a schematic diagram of an RF communication system according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system communicates by wirelessly transmitting and receiving RF signals. To provide amplification to a relatively weak RF signal received from an antenna, the RF communication system can include a low noise amplifier (LNA). The LNA can provide amplification to the received RF signal while introducing a relatively small amount of noise, thereby enhancing signal-to-noise ratio (SNR) and allowing the RF communication system to receive signals at far distances, in noisy radio environments, and/or from relatively weak transmitters.

Although an LNA typically provides amplification to weak signals of low power, an LNA can receive a relatively strong input signal during certain operating scenarios or time instances. In one example, the LNA may receive a blocker or jammer signal. In another example, RF leakage can couple from the transmit path to the receive path and into the LNA. Absent a protection mechanism, such high power signals can cause damage to the LNA and/or other circuitry of a receiver.

To prevent damage arising from high power signals, RF signal limiters can be employed in the signal path before the LNA. For example, the LNA is typically the first active component in the receive signal chain, and thus performing signal limiting before the LNA case serve to protect receive path circuitry.

The performance of an RF signal limiter can be evaluated by a number of parameters. For instance, examples of key performance metrics for RF signal limiters include maximum power handling, flat leakage, recovery time, insertion loss, and/or return loss.

Certain RF signal limiters include a field-effect transistor (FET) stack connected in shunt to an RF signal path. The gates of the FETs are biased below the threshold voltage such that during small signal operation the FETs act as off devices and the limiter provides low insertion loss to the RF signal path. However, when a large RF signal is applied to the RF signal path, the FETs switch from OFF state to ON state to provide limiting. By choosing the number and size of the FETs in the stack as well as the gate bias voltage, desired linearity and bandwidth specifications can be achieved.

However, such RF signal limiters suffer from several drawbacks arising from high on-state FET resistance during attenuation. For example, the high on-state FET resistance leads to substantial heat dissipation when attenuating and high amounts of leakage power reaching the limiter's output.

Apparatus and methods for RF signal limiters with diode-enhanced limiting are provided. In certain embodiments, an RF signal limiter includes a FET stack electrically connected between an RF signal path and a limiting node, such as ground. The FET stack includes a first or topmost FET having a drain connected to the RF signal path. The gate of the topmost FET is biased through a first gate resistor. The RF signal limiter further includes a first forward enhancement diode having an anode connected to the RF signal path and a cathode connected to the gate of topmost FET.

By including the first forward enhancement diode, the gate of the topmost FET is charged to modulate the gate voltage in response to a large forward RF signal that raises the voltage of the RF signal path over the voltage of the limiting node. This in turn lowers the on-state resistance of the FET stack and leads to improved power handling and/or leakage power compared to a limiter with similarly sized FETs but without diodes.

In certain implementations, the FET stack further includes a second or bottommost FET having a source connected to the limiting node and a gate biased through a second gate resistor. The RF signal limiter further includes a first reverse enhancement diode having an anode connected to the limiting node and a cathode connected to the gate of the bottommost FET. By including the first reverse enhancement diode, the gate of bottommost FET is charged to modulate the gate voltage in response to a large reverse RF signal that lowers the voltage of the RF signal path below the voltage of the limiting node.

Accordingly, the RF signal limiter can include additional forward and/or reverse enhancement diodes connected to the gates of the FETs to enhance performance. Such enhancement diodes can be connected in a variety of configurations as disclosed herein.

For example, the RF signal limiter can further include a second forward enhancement diode having an anode connected to the drain of the bottommost FET and a cathode connected to the gate of the bottommost FET and/or a second reverse enhancement diode having an anode connected to the source of the topmost FET and a cathode connected to the gate of topmost FET.

The FET stack can include any desired number of FETs connected in series between the RF signal path and the discharge node. For example, to provide high power handling, one or more inner FETs can be included in series between a source of the topmost FET and a drain of the bottommost FET. Such inner FETs can have gate voltages that are modulated using forward and/or reverse enhancement diodes.

The FETs can be implemented in a wide variety of ways. In certain implementations the FETs are implemented as silicon-on-insulator (SOI) transistors, such as n-type SOI transistors. The diodes can be implemented in a variety of ways, such as using p-n junction diodes and/or diode-connected transistors.

FIG. 1A is a schematic diagram of an RF communication system 10 according to one embodiment. The RF communication system 10 includes a power amplifier 1, a low noise amplifier 2, a transmit/receive (T/R) switch 3, an RF signal limiter 5, and an antenna 6.

Although, the RF communication system 10 of FIG. 1A illustrates one example of an electronic system that can include an RF signal limiter, the RF signal limiters herein can be used in other implementations of electronic systems. Additionally, although a particular configuration of components is depicted in FIG. 1A, the RF communication system 10 can be adapted and modified in a wide variety of ways. For example, the RF communication system 10 can include more or fewer receive paths and/or transmit paths. Additionally, the RF communication system 10 can be modified to include a different arrangement of components and/or more or fewer components, for example, additional RF signal limiters.

In the illustrated embodiment, the T/R switch 3 includes an antenna terminal connected to the antenna 6, a transmit signal terminal connected to an output of the power amplifier 1, and a receive signal terminal connected to an input of the LNA 2 by way of an RF signal path protected by the RF signal limiter 5. As shown in FIG. 1A, the RF signal limiter 5 is connected between the RF signal path and a discharge node (ground, in this example).

In certain implementations, a transceiver is used to generate the RF transmit signal TX and to process the RF receive signal RX. In one example, a transceiver includes an upconverting mixer for generating the RF transmit signal TX and a downconverting mixer for processing the RF receive signal. In another example, a transceiver includes an RF digital-to-analog converter for generating the RF transmit signal TX and an RF analog-to-digital converter for processing the RF receive signal. Although example transceivers are described, a wide variety of circuits can be used to generate the RF transmit signal TX and/or process the RF receive signal RX.

With continuing reference to FIG. 1A, the power amplifier 1 amplifies an RF transmit signal TX to generate an amplified RF transmit signal that is provided to the transmit signal terminal of the T/R switch 3. Additionally, the T/R switch 3 provides an RF signal received from the antenna 6 to the input of the LNA 2 by way of the RF signal path that is limited by the RF signal limiter 5. The LNA 2 amplifies the RF signal to generate the RF receive signal RX.

The T/R switch 3 controls access of the power amplifier 1 and the LNA 2 to the antenna 6 and can be well suited for certain applications, such as communications over a time-division duplexed (TDD) network. Although a configuration using the T/R switch 3 is shown, other implementations are possible, such as configurations using separate antennas for transmit and receive or configurations in which a circulator, duplexer, and/or other component(s) control access to a shared antenna.

The presence of high power signals in the receive spectrum (for example, a jammer signal) and/or RF leakage from the transmit path to the receive path can damage receive-path circuits. To prevent this, the RF signal limiter 5 is included before the LNA 2, which is typically the first active component in the receive signal chain. Accordingly, the RF signal limiter 5 serves to limit the RF receive signal to thereby protect the LNA 2 from damage.

The RF communication system 10 can handle RF signals of a wide range of frequencies, including not only those between 3 MHz and 7 GHz, but also higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide range of radio frequencies, including microwave frequencies.

Moreover, the RF communication system 10 can wirelessly communicate RF signals associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Figure 1B:
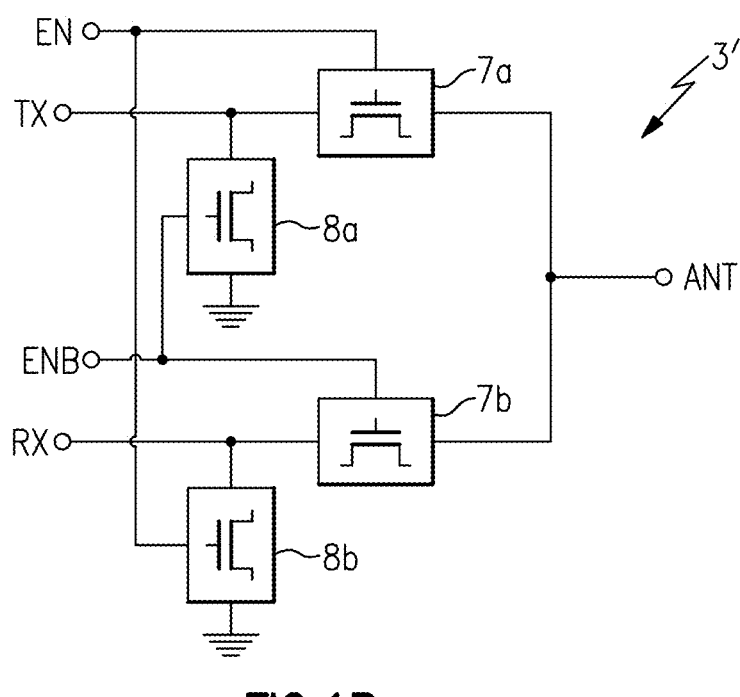
FIG. 1B is a schematic diagram of a transmit/receive switch according to one embodiment.

FIG. 1B is a schematic diagram of a transmit/receive switch 3' according to one embodiment. The transmit/receive switch 3' includes a transmit-path series FET switch 7a, a receive-path series FET switch 7b, a transmit-path shunt FET switch 8a, a receive-path shunt FET switch 8b, an antenna terminal ANT, a transmit signal terminal TX, and a receive signal terminal RX. The transmit/receive switch 3' also receives an enable signal EN and an inverted enable signal ENB for controlling the switch's state.

The transmit/receive switch 3' of FIG. 1B illustrates one implementation of a transmit/receive switch that can be used in an RF communication system. For example, the transmit/receive switch 3' of FIG. 1B can be used to implement the transmit/receive switch 3 of the RF communication system 10 of FIG. 1A.

As shown in FIG. 1B, the transmit-path series FET switch 7a is connected between the transmit signal terminal TX and the antenna terminal ANT and is controlled by the enable signal EN. Additionally, the transmit-path shunt FET switch 8a is connected between the transmit signal terminal TX and ground and is controlled by the inverted enable signal ENB. Furthermore, the receive-path series FET switch 7b is connected between the receive signal terminal RX and the antenna terminal ANT and is controlled by the inverted enable signal ENB. Additionally, the receive-path shunt FET switch 8b is connected between the receive signal terminal RX and ground and is controlled by the enable signal EN.

When the enable signal EN is activated, the transmit-path series FET switch 7a is turned on to connect the transmit signal terminal TX to the antenna terminal ANT, while the receive-path shunt FET switch 8b is turned on to connect the receive signal terminal RX to ground. Furthermore, both the transmit-path shunt FET switch 8a and the receive-path series FET switch 7b are turned off. Accordingly, the transmit path is activated, while the receive path is deactivated.

With continuing reference to FIG. 1B, when the enable signal EN is deactivated, the receive-path series FET switch 7b is turned on to connect the receive signal terminal RX to the antenna terminal ANT, while the transmit-path shunt FET switch 8a is turned on to connect the transmit signal terminal TX to ground. Furthermore, both the receive-path shunt FET switch 8b and the transmit-path series FET switch 7a are turned off. Accordingly, the receive path is activated, while the transmit path is deactivated.

Figure 1C:
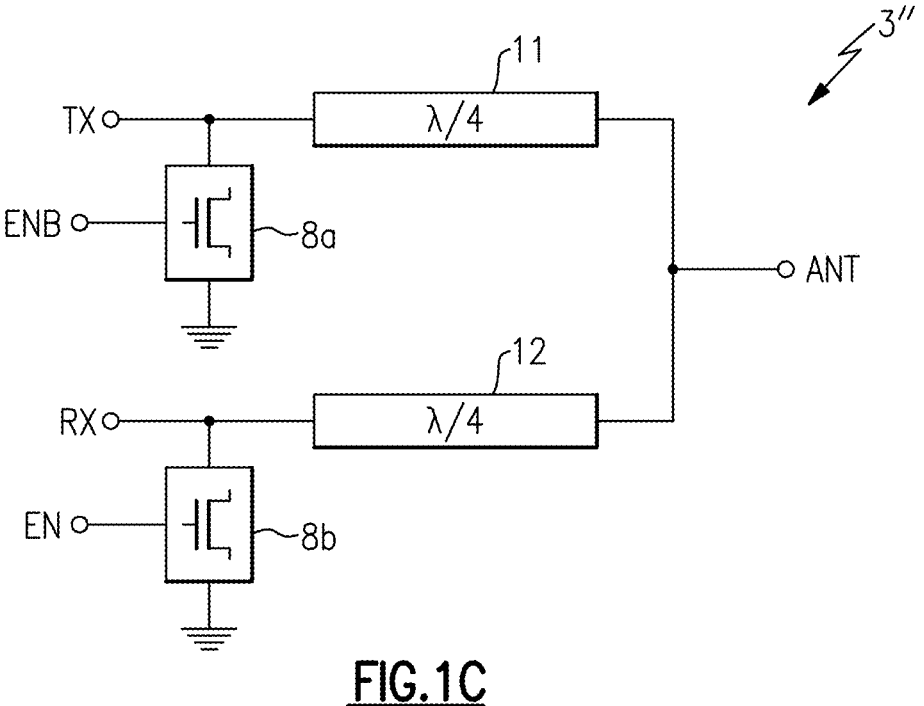
FIG. 1C is a schematic diagram of a transmit/receive switch according to another embodiment.

FIG. 1C is a schematic diagram of a transmit/receive switch 3" according to another embodiment. The transmit/receive switch 3" includes a transmit-path shunt FET switch 8a, a receive-path shunt FET switch 8b, a transmit-path quarter wavelength transmission line 11, a receive-path quarter wavelength transmission line 12, an antenna terminal ANT, a transmit signal terminal TX, and a receive signal terminal RX. The transmit/receive switch 3" also receives an enable signal EN and an inverted enable signal ENB for controlling the switch's state.

The transmit/receive switch 3" of FIG. 1C illustrates another implementation of a transmit/receive switch that can serve as the transmit/receive switch 3 of FIG. 1A.

In comparison to the transmit/receive switch 3' of FIG. 1B, the transmit/receive switch 3" of FIG. 1C omits the transmit-path series FET switch 7a and the receive-path series FET switch 7b in favor of including the transmit-path quarter wavelength transmission line 11 and the receive-path quarter wavelength transmission line 12.

When the enable signal EN is activated, the receive-path shunt FET switch 8b is turned on to connect the receive signal terminal RX to ground, while the transmit-path shunt FET switch 8a is turned off. Additionally, the impedance looking into the receive path from the antenna terminal ANT is high since the receive-path quarter wavelength transmission line 12 provides an impedance transformation that converts the low impedance (for example, short) at the receive signal terminal RX into a high impedance (for example, open) at the antenna terminal ANT.

Furthermore, when the enable signal EN is deactivated, the transmit-path shunt FET switch 8a is turned on to connect the transmit signal terminal TX to ground, while the receive-path shunt FET switch 8b is turned off. Additionally, the impedance looking into the transmit path from the antenna terminal ANT is high since the transmit-path quarter wavelength transmission line 11 provides an impedance transformation that converts the low impedance (for example, short) at the transmit signal terminal TX into a high impedance (for example, open) at the antenna terminal ANT.

Figure 1D:
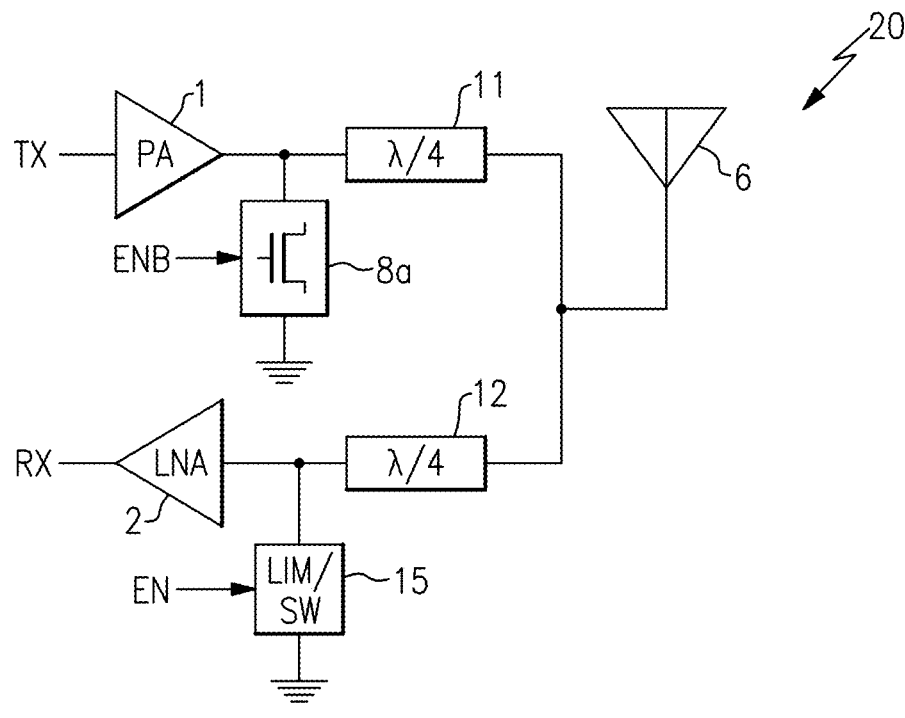
FIG. 1D is a schematic diagram of an RF communication system according to another embodiment.

FIG. 1D is a schematic diagram of an RF communication system 20 according to another embodiment. The RF communication system 20 includes a power amplifier 1, a low noise amplifier 2, an antenna 6, a transmit-path shunt FET switch 8a, a transmit-path quarter wavelength transmission line 11, a receive-path quarter wavelength transmission line 12, and an RF signal limiter/switch 15. The transmit-path shunt FET switch 8a is controlled by an inverted enable signal ENB, while the RF signal limiter/switch 15 is controlled by an enable signal EN.

The RF communication system 20 of FIG. 1D is similar to the RF communication system 10 of FIG. 1A, except that the RF communication system 20 of FIG. 1D omits the T/R switch 3 in favor of including a different implementation of a transmit-receive switch structure.

In particular, the transmit-path shunt FET switch 8a, the transmit-path quarter wavelength transmission line 11 and the receive-path quarter wavelength transmission line 12 are included in a configuration similar to that of FIG. 1C, while the RF signal limiter/switch 15 serves both the function of the RF signal limiter 5 of FIG. 1A and of the receive-path shunt FET switch 8b of FIG. 1C.

Thus, the RF signal limiter/switch 15 is implemented as both a limiter and switch to aid the RF communication system 20 in properly transmitting or receiving signals while also providing RF signal limiting when desired. For example, in certain implementations, the RF signal limiter/switch 15 is used to prevent an RF signal from reaching the input of the LNA 2 in a first or transmit mode (by shorting the RF signal path to ground), and to provide signal limiting in a second or receive mode in which an RF receive signal is amplified by the LNA 2.

Accordingly, when the transmit path through the power amplifier 1 is active in the transmit mode (when the enable signal EN is activated), the RF signal limiter/switch 15 operates to short the input of the LNA 2 to ground. Additionally, the short at the input of the LNA 2 is transformed (by way of an impedance transformation) by the receive-path quarter wavelength transmission line 12 to provide high input impedance to the LNA 2 during the transmit mode. Further, when the power amplifier 1 is inactive and the LNA 2 is active in the receive mode (when the enable signal EN is deactivated), the RF signal limiter/switch 15 can operate in the second mode to provide signal limiting.

Figures 2A, 2B:
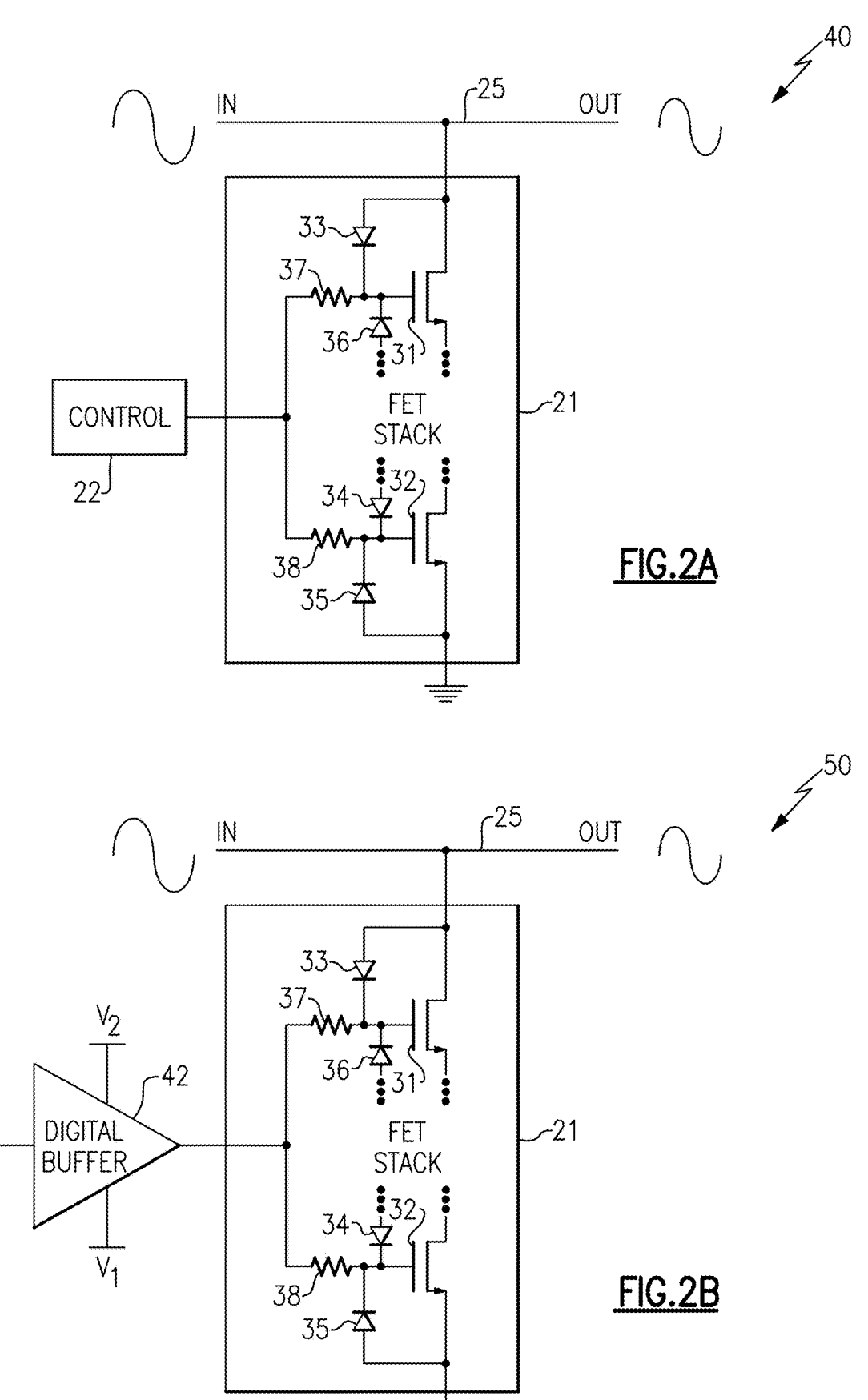
FIG. 2A is a schematic diagram of an RF signal limiter according to one embodiment.
FIG. 2B is a schematic diagram of an RF signal limiter according to another embodiment.

FIG. 2A is a schematic diagram of an RF signal limiter 40 according to one embodiment. The RF signal limiter 40 includes a FET stack 21 connected between an RF signal path 25 and a discharge node (ground, in this example). The RF signal path 25 includes an input IN for receiving an RF signal and an output OUT for providing a limited RF signal. The RF signal limiter 40 further includes a gate control circuit 22 for controlling the DC gate bias voltage of the FET stack 21.

With continuing reference to FIG. 2A, the FET stack 21 includes a first or topmost FET 31 having a drain connected to the RF signal path 25, and a second or bottommost FET 32 having a source connected to the discharge node.

Although two FETs are depicted in FIG. 2A, more or fewer FETs can be include in the FET stack 21. For example, the number of FETs in the stack can be selected to achieve a desired power handling capability. In certain implementations, the FETs are implemented as SOI transistors. Thus, the RF signal limiter 40 can be implemented on-chip as part of a semiconductor die fabricated using an SOI process.

As shown in FIG. 2A, a first gate resistor 37 is connected between a gate of the first FET 31 and a control terminal that is controlled by the gate control circuit 22 and that serves as AC ground. Additionally, a second gate resistor 38 is connected between a gate of the second FET 32 and the control terminal. The gate control circuit 22 can be implemented in a wide variety of ways. In one example, the gate control circuit 22 is implemented as a DC bias circuit that generates a DC gate bias voltage for the FET stack 21. In another example, the gate control circuit 22 receives a control signal for adjusting the DC gate bias voltage to a desired DC voltage level.

With continuing reference to FIG. 2A, enhancement diodes are included for the FET stack 21 to enhance forward and reverse limiting characteristics. In the illustrated embodiment, a first forward enhancement diode 33 includes an anode connected to the RF signal path 25 and a cathode connected to the gate of the first FET 31. Additionally, a second forward enhancement diode 34 includes an anode (which can be connected to a drain of the second FET 32 or other suitable node of the FET stack 21) and a cathode connected to the gate of the second FET 32. Furthermore, a first reverse enhancement diode 35 includes an anode connected to the discharge node and a cathode connected to the gate of the second FET 32. Additionally, a second reverse enhancement diode 36 includes an anode (which can be connected to a source of the second FET 31 or other suitable node of the FET stack 21) and a cathode connected to the gate of the first FET 31.

By including one or more enhancement diodes, forward and/or reverse limiting characteristics of the RF signal limiter 40 can be improved relative to an implementation with similarly-sized FETs in which the diodes are omitted.

For example, the forward enhancement diodes 33 and 34 operate to module the gate voltage of the first FET 31 and the second FET 32, respectively, in response to an RF signal that raises the voltage of the RF signal path over the voltage of the limiting node by a forward threshold voltage. This is turn lowers the on-state resistance of the FET stack 21 and leads to improved power handling and/or leakage power compared to a limiter with similarly sized FETs but without diodes. Furthermore, the reverse enhancement diodes 35 and 36 operate to module the gate voltage of the second FET 32 and the first FET 31, respectively, in response to an RF signal that lowers the voltage of the RF signal path 25 below the voltage of the limiting node by a reverse threshold voltage.

FIG. 2B is a schematic diagram of an RF signal limiter 50 according to another embodiment. The RF signal limiter 50 includes a FET stack 21 connected between an RF signal path 25 and a discharge node (ground, in this example). The RF signal limiter 50 further includes a digital buffer 42 for controlling the DC gate bias voltage of the FET stack 21 based on a state of an enable signal EN.

The RF signal limiter 50 of FIG. 2B is similar to the RF signal limiter 40 of FIG. 2A, except that the RF signal limiter 50 includes a specific implementation of a control circuit. In particular, the digital buffer 42 for controlling the DC gate bias voltage of the FET stack 21 to a first voltage level $V_1$ in a first state of the enable signal EN, and to a second voltage level $V_2$ in a second state of the enable signal EN.

The RF signal limiter 50 can be well-suited for applications in which multi-functional capability is desired.

For example, the RF signal limiter 50 can be used in the RF signal communication system 20 of FIG. 1D to serve as a limiter in a receive mode (for example, by setting the gate bias voltage to the first voltage level $V_1$) and as a switch in a transmit mode (for example, by setting the gate bias voltage to the second voltage level $V_2$ to provide low impedance from the RF signal path to the discharge node and preventing an RF signal from propagating from the input IN to the output OUT). Thus, the RF signal limiter 50 can be enabled or disabled as desired.

In general, the RF signal limiter 50 can be integrated as part of an RF switch, such as a single-pole single throw (SPST) switch in which the control signal sets the RF signal limiter 50 between a switch OFF state and a switch ON (or limiter) state. Thus, for the switch OFF state, the gate control voltage is high to bias the FET gates so that the transistors are ON. Accordingly, propagation of the RF signal from the input IN to the output OUT is prevented.

For the switch ON (or limiter) state, the gate control voltage can be set just below the threshold voltage to bias the FETs such that the FETs are off. Accordingly, for small signals the input IN is connected to the output OUT as a turned on switch but when the RF signal gets larger then self-limiting mechanism operates to limit the signal power to a certain level.

Furthermore, multiple branches of the RF signal limiter 50 can be included to build larger RF switch structures including, but not limited to, single pole double throw (SPDT) switches, single pole triple throw (SP3T) switches, or switches with additional poles and/or throws.

FIG. 3 is a schematic diagram of an RF signal limiter 160 according to another embodiment. The RF signal limiter 160 includes a stack of FETs connected between an RF signal path 25 and a discharge node (ground in this example). The stack of FETs includes a first or topmost FET 101, a second or bottommost FET 102, and a third or inner FET 103 between the first FET 101 and the second FET 102. The RF signal limiter 160 further includes a first gate resistor 111, a second gate resistor 112, a third gate resistor 113, a first body resistor 121, a second body resistor 122, a third body resistor 123, a first forward enhancement diode 131, a second forward enhancement diode 132, a third forward enhancement diode 133, a first reverse enhancement diode 141, a second reverse enhancement diode 142, a third reverse enhancement diode 143, a gate bias voltage source 151, and a body bias voltage source 152.

Although three FETs and corresponding components are depicted, more or fewer FETs and corresponding components can be included. For example, the number of FETs can be chosen based on a desired power handling capability of the RF signal limiter 160.

As shown in FIG. 3, the first FET 101, the third FET 103, and the second FET 102 are connected in series between the RF signal path 25 and the discharge node, with a drain of the first FET 101 connected to the RF signal path 25 and with a source of the second FET 102 connected to the discharge node. The gate bias voltage source 151 provides a gate bias voltage to a control terminal. The gate resistors 111-113 are connected between the control terminal and the gates of the FETs 101-103, respectively. Additionally, the body resistors 111-113 are connected between the body bias voltage source 152 and the bodies of the FETs 101-103, respectively.

In the illustrated embodiment, the first forward enhancement diode 131 includes an anode connected to the drain of the first FET 101 and a cathode connected to the gate of the first FET 101. Additionally, the second forward enhancement diode 132 includes an anode connected to the drain of the second FET 102 and a cathode connected to the gate of the second FET 102. Furthermore, the third forward enhancement diode 133 includes an anode connected to the drain of the third FET 103 and a cathode connected to the gate of the third FET 103. Additionally, the first reverse enhancement diode 141 includes an anode connected to the source of the second FET 102 and a cathode connected to the gate of the second FET 102. Furthermore, the second reverse enhancement diode 142 includes an anode connected to the source of the first FET 101 and a cathode connected to the gate of the first FET 101. Additionally, the third reverse enhancement diode 143 includes an anode connected to the source of the third FET 103 and a cathode connected to the gate of the third FET 103.

Accordingly, external drain-to-gate and source-to-gate diodes are provided for each of the FETs in the stack.

By connecting the diodes in this manner, the gate voltages of the FETs are shifted to provide increased overdrive voltage and decreased on-state resistance when limiting. Such decreased on-state resistance leads to lower power dissipation, which relives the transistor's junction temperature. According, smaller FET sizes can be used providing higher bandwidth for a given power handling, or conversely, higher power handling can be achieved for a given bandwidth.

Moreover, the diode-enhanced limiting provides a more robust shorting of the RF signal path 25, leading to a decrease in leakage power at the output OUT of the limiter 160.

Figure 4:
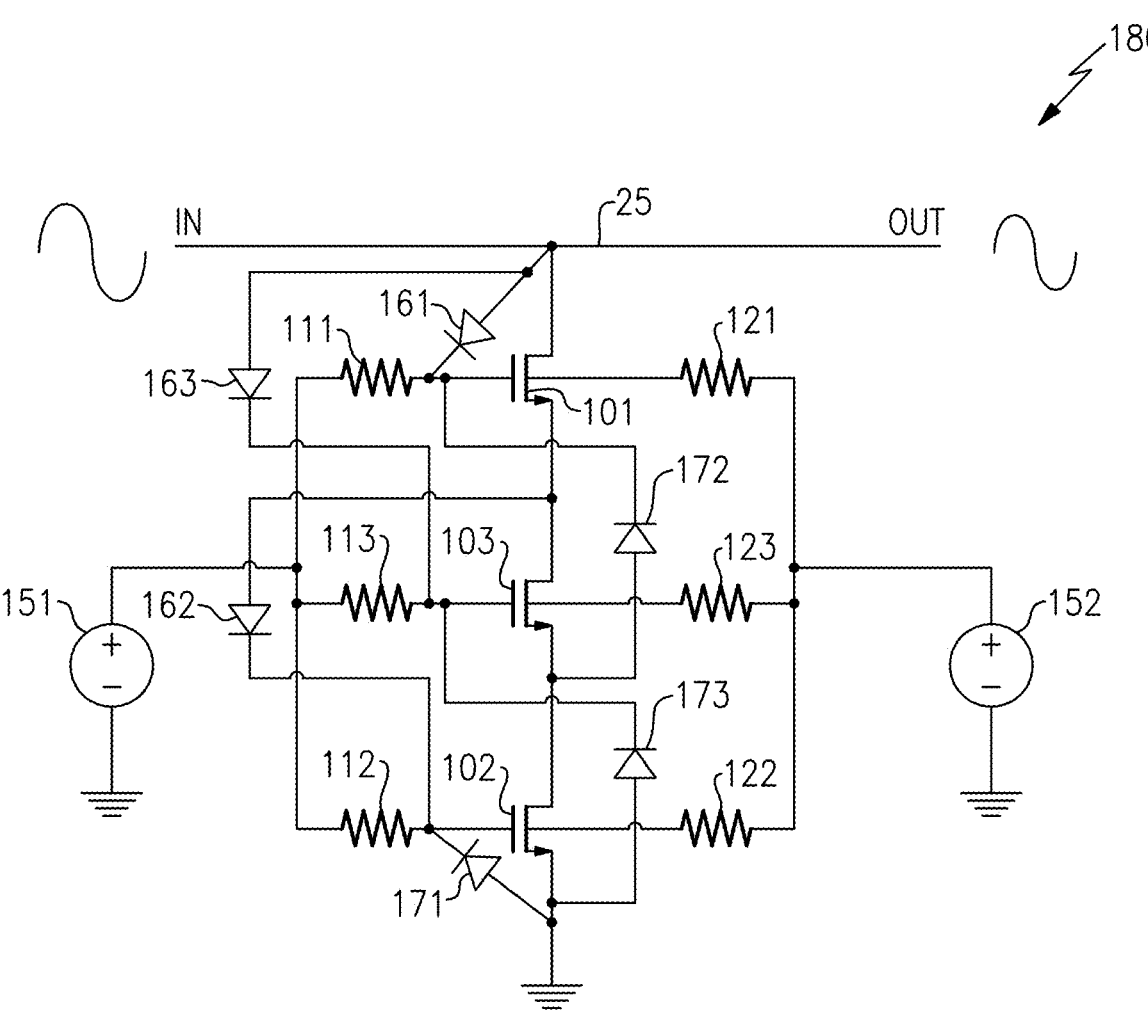
FIG. 4 is a schematic diagram of an RF signal limiter according to another embodiment.

FIG. 4 is a schematic diagram of an RF signal limiter 180 according to another embodiment. The RF signal limiter 180 includes a first FET 101, a second FET 102, a third FET 103, a first gate resistor 111, a second gate resistor 112, a third gate resistor 113, a first body resistor 121, a second body resistor 122, a third body resistor 123, a first forward enhancement diode 161, a second forward enhancement diode 162, a third forward enhancement diode 163, a first reverse enhancement diode 171, a second reverse enhancement diode 172, a third reverse enhancement diode 173, a gate bias voltage source 151, and a body bias voltage source 152.

The RF signal limiter 180 of FIG. 4 is similar to the RF signal limiter 160 of FIG. 3, except that the RF signal limiter 180 of FIG. 4 depicts a different connectivity of the forward and reverse enhancement diodes.

In the illustrated embodiment, the first forward enhancement diode 161 includes an anode connected to the drain of the first FET 101 and a cathode connected to the gate of the first FET 101. Additionally, the second forward enhancement diode 162 includes an anode connected to the drain of the third FET 103 and a cathode connected to the gate of the second FET 102. Furthermore, the third forward enhancement diode 163 includes an anode connected to the drain of the first FET 101 and a cathode connected to the gate of the third FET 103. Additionally, the first reverse enhancement diode 171 includes an anode connected to the source of the second FET 102 and a cathode connected to the gate of the second FET 102. Furthermore, the second reverse enhancement diode 172 includes an anode connected to the source of the third FET 103 and a cathode connected to the gate of the first FET 101. Additionally, the third reverse enhancement diode 173 includes an anode connected to the source of the second FET 102 and a cathode connected to the gate of the third FET 103.

Accordingly, in the embodiment of FIG. 4, external diodes for the gate of a given FET are connected to the drains or sources or of other FETs that are higher or lower in the stack as appropriate.

By connecting the diodes in this manner, the gate modulation is even higher, thereby leading to increased overdrive voltages and smaller on-state resistance.

Figure 5:
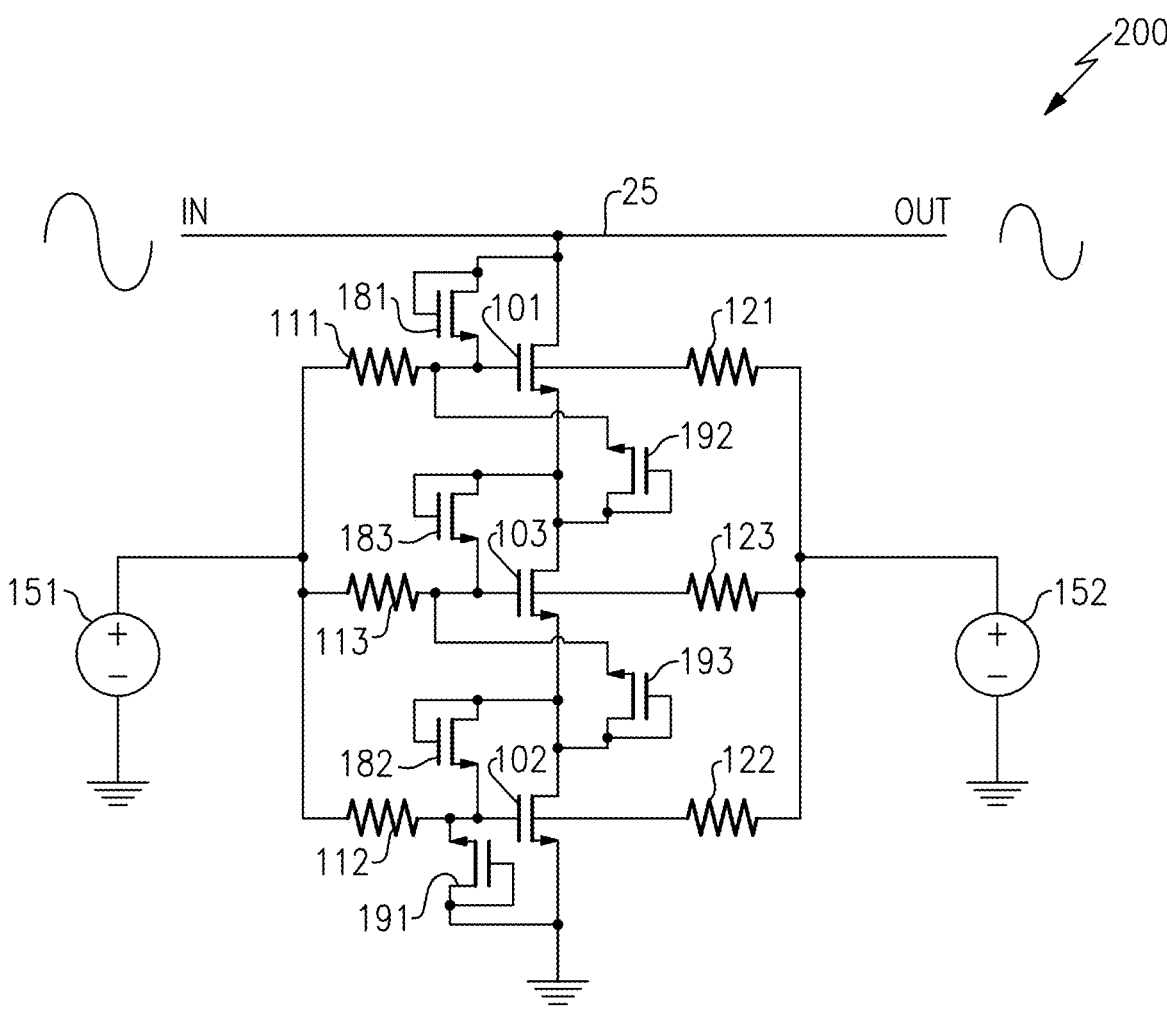
FIG. 5 is a schematic diagram of an RF signal limiter according to another embodiment.

FIG. 5 is a schematic diagram of an RF signal limiter 200 according to another embodiment. The RF signal limiter 200 includes a first FET 101, a second FET 102, a third FET 103, a first gate resistor 111, a second gate resistor 112, a third gate resistor 113, a first body resistor 121, a second body resistor 122, a third body resistor 123, a first forward enhancement diode-connected FET 181, a second forward enhancement diode-connected FET 182, a third forward enhancement diode-connected FET 183, a first reverse enhancement diode-connected FET 191, a second reverse enhancement diode-connected FET 192, a third reverse enhancement diode-connected FET 193, a gate bias voltage source 151, and a body bias voltage source 152.

The RF signal limiter 200 of FIG. 5 is similar to the RF signal limiter 160 of FIG. 3, except that the RF signal limiter 200 of FIG. 5 depicts a specific implementation in which the forward and reverse enhancement diodes are implemented as diode-connected FETs.

In the illustrated embodiment, the first forward enhancement diode-connected FET 181 includes an anode (drain and gate) connected to the drain of the first FET 101 and a cathode (source) connected to the gate of the first FET 101. Additionally, the second forward enhancement diode-connected FET 182 includes an anode connected to the drain of the second FET 102 and a cathode connected to the gate of the second FET 102. Furthermore, the third forward enhancement diode-connected FET 183 includes an anode connected to the drain of the third FET 103 and a cathode connected to the gate of the third FET 103. Additionally, the first reverse enhancement diode-connected FET 191 includes an anode connected to the source of the second FET 102 and a cathode connected to the gate of the second FET 102. Furthermore, the second reverse enhancement diode-connected FET 192 includes an anode connected to the source of the first FET 101 and a cathode connected to the gate of the first FET 101. Additionally, the third reverse enhancement diode-connected FET 193 includes an anode connected to the source of the third FET 103 and a cathode connected to the gate of the third FET 103.

Accordingly, a forward or reverse enhancement diode can be implemented with a diode connected FET. Since diode connected FETs have lower threshold values than typical p-n junction diodes, their turn on voltages are less. Thus, increased gate modulation is achieved, thereby leading to increased overdrive voltages and smaller on-state resistance.

Figure 6:
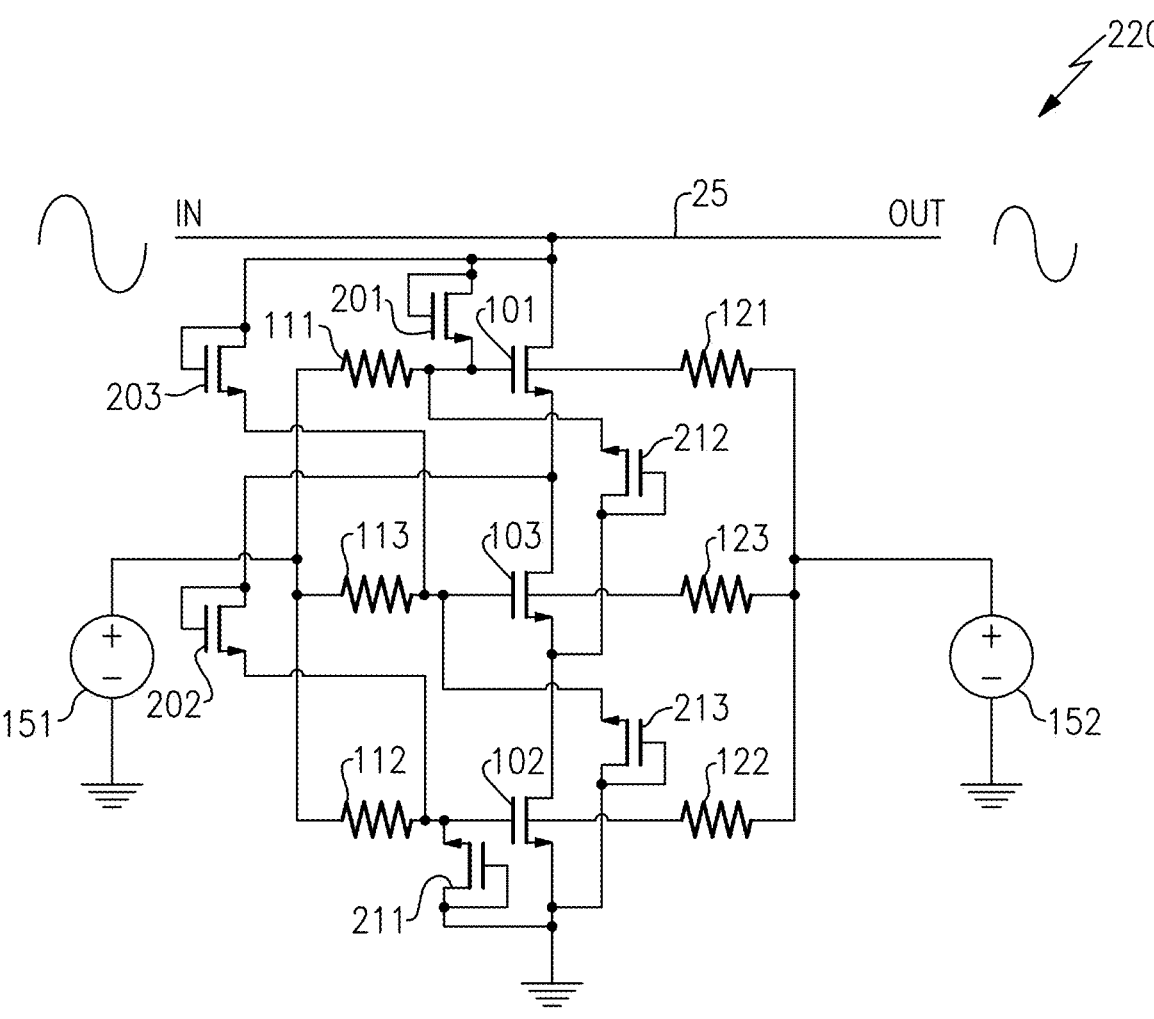
FIG. 6 is a schematic diagram of an RF signal limiter according to another embodiment.

FIG. 6 is a schematic diagram of an RF signal limiter 220 according to another embodiment. The RF signal limiter 220 includes a first FET 101, a second FET 102, a third FET 103, a first gate resistor 111, a second gate resistor 112, a third gate resistor 113, a first body resistor 121, a second body resistor 122, a third body resistor 123, a first forward enhancement diode-connected FET 201, a second forward enhancement diode-connected FET 202, a third forward enhancement diode-connected FET 203, a first reverse enhancement diode-connected FET 211, a second reverse enhancement diode-connected FET 212, a third reverse enhancement diode-connected FET 213, a gate bias voltage source 151, and a body bias voltage source 152.

The RF signal limiter 220 of FIG. 6 is similar to the RF signal limiter 180 of FIG. 4, except that the RF signal limiter

220 of FIG. 6 depicts a specific implementation in which the forward and reverse enhancement diodes are implemented as diode-connected FETs.

In the illustrated embodiment, the first forward enhancement diode-connected FET 201 includes an anode (drain and gate) connected to the drain of the first FET 101 and a cathode (source) connected to the gate of the first FET 101. Additionally, the second forward enhancement diode-connected FET 202 includes an anode connected to the drain of the third FET 103 and a cathode connected to the gate of the second FET 102. Furthermore, the third forward enhancement diode-connected FET 203 includes an anode connected to the drain of the first FET 101 and a cathode connected to the gate of the third FET 103. Additionally, the first reverse enhancement diode-connected FET 211 includes an anode connected to the source of the second FET 102 and a cathode connected to the gate of the second FET 102. Furthermore, the second reverse enhancement diode-connected FET 212 includes an anode connected to the source of the third FET 103 and a cathode connected to the gate of the first FET 101. Additionally, the third reverse enhancement diode-connected FET 213 includes an anode connected to the source of the second FET 102 and a cathode connected to the gate of the third FET 103.

Figure 7A:
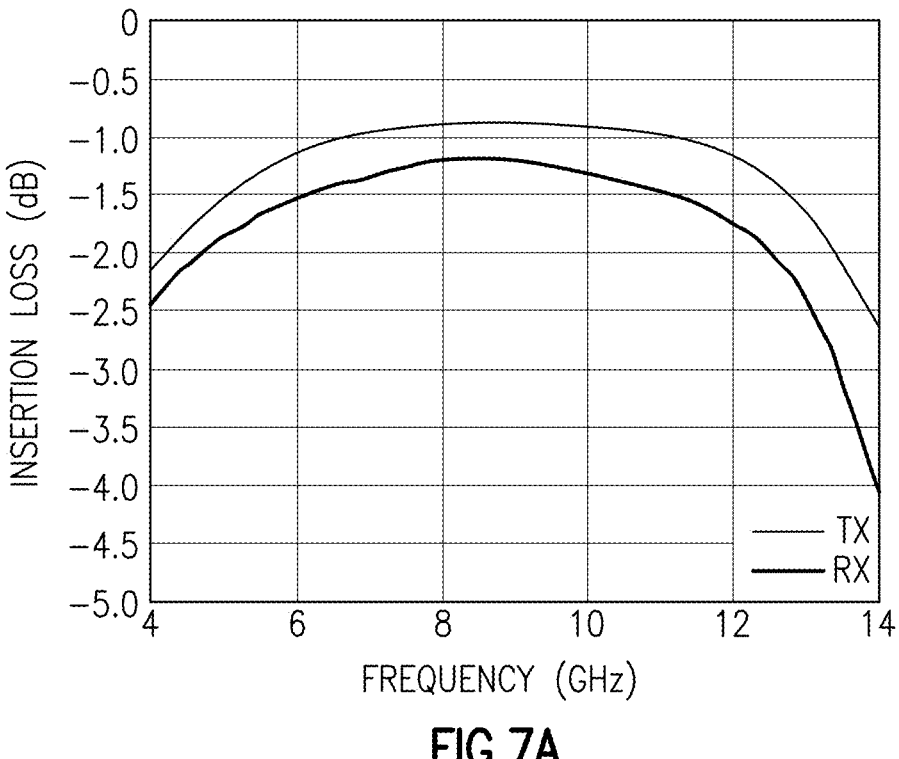
FIG. 7A is graph of one example of insertion loss versus frequency for an RF signal limiter.

FIG. 7A is graph of one example of insertion loss versus frequency for an RF signal limiter. The graph includes plots for a multi-mode RF signal limiter implemented in accordance with the digital buffer 42 of FIG. 2B and with the FET stack and diode arrangement of FIG. 6. Plots are included for operating the RF signal limiter in a transmit mode and a receive mode.

Figure 7B:
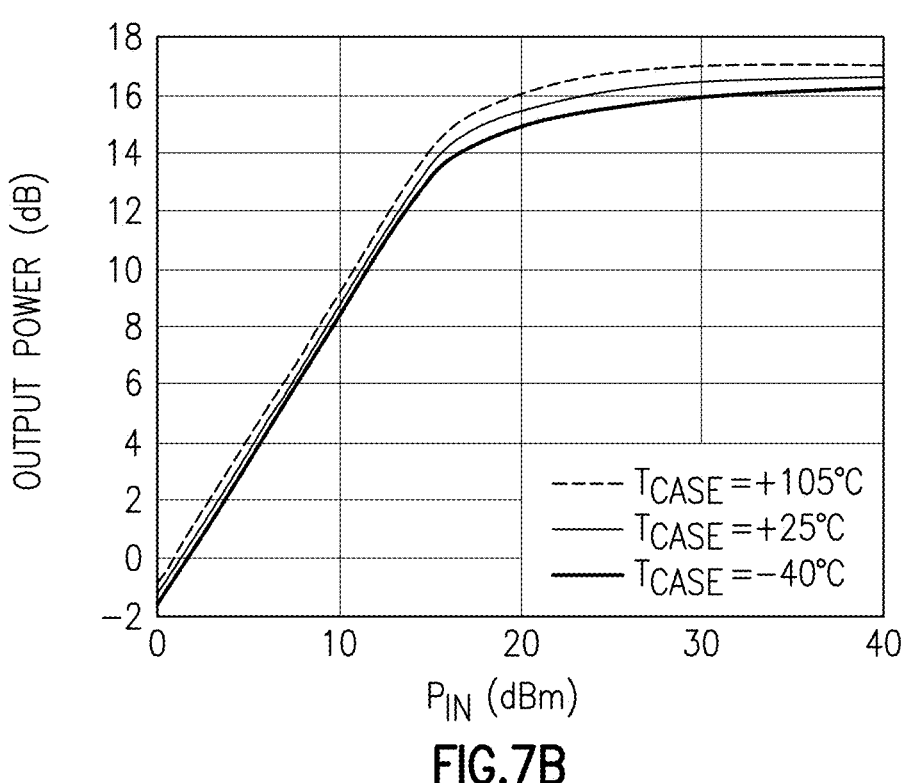
FIG. 7B is graph of one example of output power versus input power for an RF signal limiter.

FIG. 7B is graph of one example of output power versus input power for an RF signal limiter. The graph includes plots for a multi-mode RF signal limiter implemented in accordance with the digital buffer 42 of FIG. 2B and with the FET stack and diode arrangement of FIG. 6. The plots are depicted for three temperatures. In RX mode, when at 40 dBm input power, flat leakage is measured less than 18 dBm.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A radio frequency (RF) signal limiter comprising:
an RF signal path configured to receive an RF signal;
a field-effect transistor (FET) stack electrically connected between the RF signal path and a limiting node, wherein the FET stack includes a first FET having a drain connected to the RF signal path and a second FET in series with the first FET;
a first gate resistor connected between a control terminal and a gate of the first FET;
a second gate resistor connected between the control terminal and a gate of the second FET;
a first reverse enhancement diode having an anode connected to the limiting node and a cathode connected to the gate of the second FET; and
a first forward enhancement diode having an anode connected to the RF signal path and a cathode connected to the gate of the first FET.

2. The RF signal limiter of claim 1, further comprising a second reverse enhancement diode having an anode connected to the source of the first FET and a cathode connected to the gate of the first FET, and a second forward enhancement diode having an anode connected to the drain of the second FET and a cathode connected to the gate of the second FET.

3. The RF signal limiter of claim 2, wherein the FET stack further include a third FET between the first FET and the second FET, the RF signal limiter further comprising a third gate resistor connected between the control terminal and a gate of the third FET, a third forward enhancement diode having an anode connected to a drain of the third FET and a cathode connected to the gate of the third FET, and a third reverse enhancement diode having an anode connected to a source of the third FET and a cathode connected to the gate of the third FET.

4. The RF signal limiter of claim 1, wherein the FET stack further comprises a third FET between the first FET and the second FET, the RF signal limiter further comprising a second reverse enhancement diode having an anode connected to a source of the third FET and a cathode connected to the gate of the first FET.

5. The RF signal limiter of claim 4, further comprising a second forward enhancement diode having an anode connected to a drain of the third FET and a cathode connected to the gate of the second FET.

6. The RF signal limiter of claim 5, further comprising a third gate resistor connected between the control terminal and a gate of the third FET, a third forward enhancement diode having an anode connected to the drain of the first FET and a cathode connected to the gate of the third FET, and a third reverse enhancement diode having an anode connected to a source of the second FET and a cathode connected to the gate of the third FET.

7. The RF signal limiter of claim 1, wherein the first forward enhancement diode is a diode-connected FET.

8. The RF signal limiter of claim 1, further comprising a digital buffer configured to set the control terminal to a first voltage level in a first state of an enable signal, and to a second voltage level in a second state of the enable signal.

9. The RF signal limiter of claim 1, wherein the first FET comprises a silicon-on-insulator (SOI) transistor.

10. A radio frequency (RF) communication system comprising:
an RF amplifier configured to amplify an RF signal received from an RF signal path; and
an RF signal limiter comprising:
a field-effect transistor (FET) stack electrically connected between the RF signal path and a limiting node, wherein the FET stack includes a first FET having a drain connected to the RF signal path and a second FET in series with the first FET;
a first gate resistor connected between a control terminal and a gate of the first FET;
a second gate resistor connected between the control terminal and a gate of the second FET;
a first reverse enhancement diode having an anode connected to the limiting node and a cathode connected to the gate of the second FET; and
a first forward enhancement diode having an anode connected to the RF signal path and a cathode connected to the gate of the first FET.

11. The RF communication system of claim 10, wherein the RF signal limiter further comprises a second reverse enhancement diode having an anode connected to the source of the first FET and a cathode connected to the gate of the first FET, and a second forward enhancement diode having an anode connected to the drain of the second FET and a cathode connected to the gate of the second FET.

12. The RF communication system of claim 11, wherein the FET stack further comprises a third FET between the first FET and the second FET, the RF signal limiter further comprising a third gate resistor connected between the control terminal and a gate of the third FET, a third forward enhancement diode having an anode connected to a drain of the third FET and a cathode connected to the gate of the third FET, and a third reverse enhancement diode having an anode connected to a source of the third FET and a cathode connected to the gate of the third FET.

13. The RF communication system of claim 10, wherein the FET stack further comprises a third FET between the first FET and the second FET, the RF signal limiter further comprising a second reverse enhancement diode having an anode connected to a source of the third FET and a cathode connected to the gate of the first FET.

14. The RF communication system of claim 13, further comprising a second forward enhancement diode having an anode connected to a drain of the third FET and a cathode connected to the gate of the second FET.

15. The RF communication system of claim 14, further comprising a third gate resistor connected between the control terminal and a gate of the third FET, a third forward enhancement diode having an anode connected to the drain of the first FET and a cathode connected to the gate of the third FET, and a third reverse enhancement diode having an anode connected to a source of the second FET and a cathode connected to the gate of the third FET.

16. The RF communication system of claim 10, wherein the first forward enhancement diode is a diode-connected FET.

17. The RF communication system of claim 10, further comprising a digital buffer configured to set the control terminal to a first voltage level in a first state of an enable signal, and to a second voltage level in a second state of the enable signal.

18. A method of radio frequency (RF) signal limiting, the method comprising:

receiving an RF signal on an RF signal path;

limiting the RF signal using a field-effect transistor (FET) stack electrically connected between the RF signal path and a limiting node, wherein the FET stack includes a first FET having a drain connected to the RF signal path and a second FET in series with the first FET;

biasing the FET stack using a control terminal that is connected to a gate of the first FET through a first gate resistor and to a gate of the second FET through a second gate resistor;

modulating a voltage of the gate of the second FET using a first reverse enhancement diode having an anode connected to the limiting node and a cathode connected to the gate of the second FET; and modulating a voltage of the gate of the first FET using a first forward enhancement diode having an anode connected to the RF signal path and a cathode connected to the gate of the first FET.

19. The method of claim 18, wherein the first reverse enhancement diode is a diode-connected FET.

20. The method of claim 18, wherein the first forward enhancement diode is a diode-connected FET.

* * * * *